(12) United States Patent
Chen et al.

(10) Patent No.: US 9,224,611 B2
(45) Date of Patent: Dec. 29, 2015

(54) SEMICONDUCTOR STRUCTURE AND MANUFACTURING METHOD AND OPERATING METHOD OF THE SAME

(75) Inventors: Shih-Hung Chen, Jhudong Township, HsinChu County (TW); Hang-Ting Lue, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 225 days.

(21) Appl. No.: 13/570,411

(22) Filed: Aug. 9, 2012

(65) Prior Publication Data
US 2014/0043067 A1    Feb. 13, 2014

(51) Int. Cl.
| H03K 3/00 | (2006.01) |
| H01L 21/28 | (2006.01) |
| H01L 23/48 | (2006.01) |
| H01L 29/66 | (2006.01) |
| H01L 29/792 | (2006.01) |
| H01L 27/115 | (2006.01) |

(52) U.S. Cl.
CPC ...... *H01L 21/28282* (2013.01); *H01L 27/1157* (2013.01); *H01L 29/66833* (2013.01); *H01L 29/792* (2013.01); *H01L 2924/0002* (2013.01)

(58) Field of Classification Search
CPC . H01L 21/28282; H01L 23/48; H01L 29/792; H01L 29/66833; H01L 27/1157; H01L 27/115; H01L 29/41791; H01L 29/66795; H01L 29/785; H01L 21/823431; H01L 21/823821; H01L 21/845; H01L 27/0886; H01L 27/0924; H01L 27/1211
USPC ............. 257/784, E21.158, E23.01; 438/597; 327/109
See application file for complete search history.

(56) References Cited

U.S. PATENT DOCUMENTS

| 7,161,206 | B2 * | 1/2007 | Oh et al. ........................ 257/316 |
| 7,535,060 | B2 | 5/2009 | Orlowski |
| 7,829,932 | B2 * | 11/2010 | Song et al. .................... 257/315 |
| 7,867,883 | B2 * | 1/2011 | Lee et al. ....................... 438/525 |
| 2004/0145000 | A1 * | 7/2004 | An et al. ........................ 257/270 |
| 2005/0245024 | A1 | 11/2005 | von Schwerin |
| 2007/0210338 | A1 * | 9/2007 | Orlowski ....................... 257/213 |
| 2008/0157182 | A1 * | 7/2008 | Song et al. .................... 257/321 |
| 2013/0270627 | A1 * | 10/2013 | Cheng et al. .................. 257/326 |

FOREIGN PATENT DOCUMENTS

CN        101427380 A        5/2009

OTHER PUBLICATIONS

CN Office Action dated Jul. 22, 2015 in corresponding Chinese application (No. 201210282154.5).

* cited by examiner

*Primary Examiner* — Colleen A Matthews
*Assistant Examiner* — David Spalla
(74) *Attorney, Agent, or Firm* — McClure, Qualey & Rodack, LLP

(57) ABSTRACT

A semiconductor structure and a manufacturing method and an operating method of the same are provided. The semiconductor structure includes a substrate, a main body structure, a first dielectric layer, a first conductive strip, a second conductive strip, a second dielectric layer, and a conductive structure. The main body structure is formed on the substrate, and the first dielectric layer is formed on the substrate and surrounding two sidewalls and a top portion of the main body structure. The first conductive strip and the second conductive strip are formed on two sidewalls of the first dielectric layer, respectively. The second dielectric layer is formed on the first dielectric layer, the first conductive strip, and the second conductive strip. The conductive structure is formed on the second dielectric layer.

19 Claims, 16 Drawing Sheets

SEMICONDUCTOR STRUCTURE AND MANUFACTURING METHOD AND OPERATING METHOD OF THE SAME

BACKGROUND OF THE INVENTION

1. Field of the Invention

The disclosure relates in general to a semiconductor structure and a manufacturing method and an operating method of the same, and more particularly to a semiconductor structure and a manufacturing method and an operating method of the same for a memory device.

2. Description of the Related Art

In recent years, the structures of semiconductor devices have been changed constantly, and the storage capacity of the devices has been increased continuously. Memory devices are used in storage elements for many products such as MP3 players, digital cameras, computer files, etc. As the application increases, the demand for memory devices focuses on small sizes and large memory capacities. However, as the size of memory devices is reduced, the storage volume of electrons is decreased, and the reliability of memory cells is decreased.

As such, it is desirable to develop memory devices with reduced sizes, greater storage capacities, and improved reliability.

SUMMARY OF THE INVENTION

The invention is directed to a semiconductor structure and a manufacturing method and an operating method of the same, which can be used in memory devices. By forming a first conductive strip and a second conductive strip on two sidewalls of a main body structure in the semiconductor structure, respectively, the memory storage capacity in an unit area along horizontal directions can be effectively increased, the size of memory devices can be reduced while a sufficient memory storage capacity is maintained, and the operation control and reliability of memory devices can be improved.

According to one embodiment of the present disclosure, a semiconductor structure is provided. The semiconductor structure comprises a substrate, a main body structure, a first dielectric layer, a first conductive strip, a second conductive strip, a second dielectric layer, and a conductive structure. The main body structure is formed on the substrate, and the first dielectric layer is formed on the substrate and surrounding two sidewalls and a top portion of the main body structure. The first conductive strip and the second conductive strip are formed on two sidewalls of the first dielectric layer, respectively. The second dielectric layer is formed on the first dielectric layer, the first conductive strip, and the second conductive strip. The conductive structure is formed on the second dielectric layer.

According to one embodiment of the present disclosure, a method of manufacturing a semiconductor structure is provided The method comprises following steps: forming a main body structure on a substrate; forming a first dielectric layer on the substrate, wherein the first dielectric layer surrounds two sidewalls and a top portion of the main body structure; forming a first conductive strip and a second conductive strip on two sidewalls of the first dielectric layer, respectively; forming a second dielectric layer on the first dielectric layer, the first conductive strip, and the second conductive strip; and forming a conductive structure on the second dielectric layer.

According to one embodiment of the present disclosure, a method of operating a semiconductor structure is provided. The method comprises following steps: providing a semiconductor structure, wherein the semiconductor structure comprises a substrate, a plurality of main body structures, a plurality of first dielectric layers, a plurality of first conductive strips, a plurality of second conductive strips, a plurality of second dielectric layers, and a plurality of conductive structures; and selecting at least one of the first conductive strips and the second conductive strips to be turned on. The main body structures are formed on the substrate, the first dielectric layers are formed on the substrate and surrounding two sidewalls and a top portion of each of the main body structures, and the first conductive strips and the second conductive strips are formed on two sidewalls of the first dielectric layers, respectively. The second dielectric layers are formed on the first dielectric layer, the first conductive strips, and the second conductive strips. And, the conductive structures are formed on the second dielectric layers.

The disclosure will become apparent from the following detailed description of the preferred but non-limiting embodiments. The following description is made with reference to the accompanying drawings.

DETAILED DESCRIPTION OF THE INVENTION

In the embodiment of the present disclosure, a semiconductor structure and a manufacturing method and an operating method of the same are provided. By forming a first conductive strip and a second conductive strip on two sidewalls of a main body structure in the semiconductor structure, respectively, the memory storage capacity in an unit area along horizontal directions can be effectively increased, the size of memory devices can be reduced while a sufficient memory storage capacity is maintained, and the operation control and reliability of memory devices can be improved. The embodiments disclosed below are for elaborating the semiconductor structure of the disclosure. However, the descriptions disclosed in the embodiments of the disclosure such as detailed structures, manufacturing procedures, operating procedures, and material selections are for illustration only, not for limiting the scope of protection of the disclosure.

Figure 1:
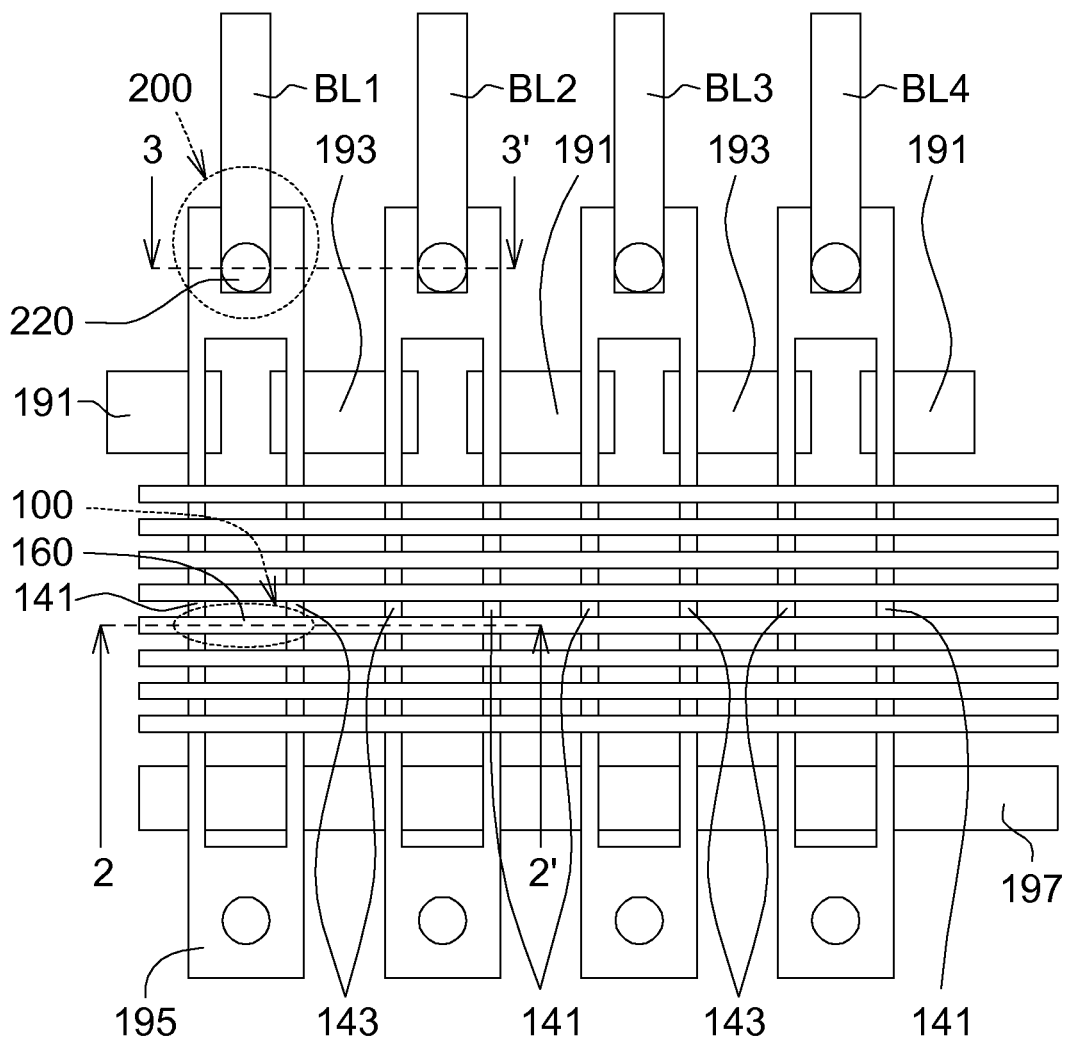
FIG. 1 shows a top view of a semiconductor structure according to an embodiment of the present disclosure.
Figure 2A:
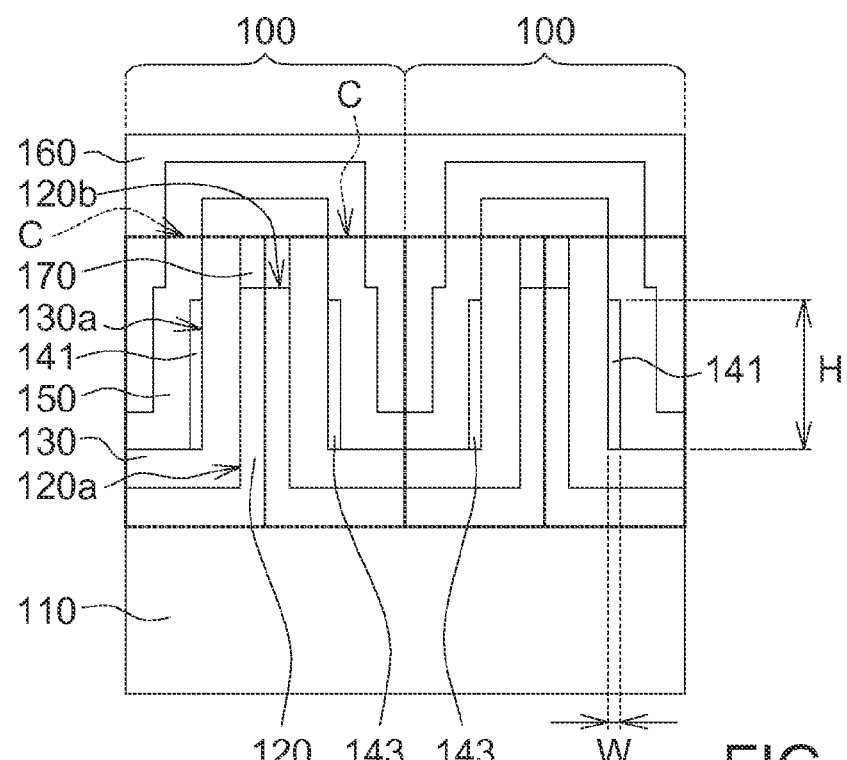
FIGS. 2A-2B show cross-sectional views along the section line 2-2' in FIG. 1.
Figure 2B:
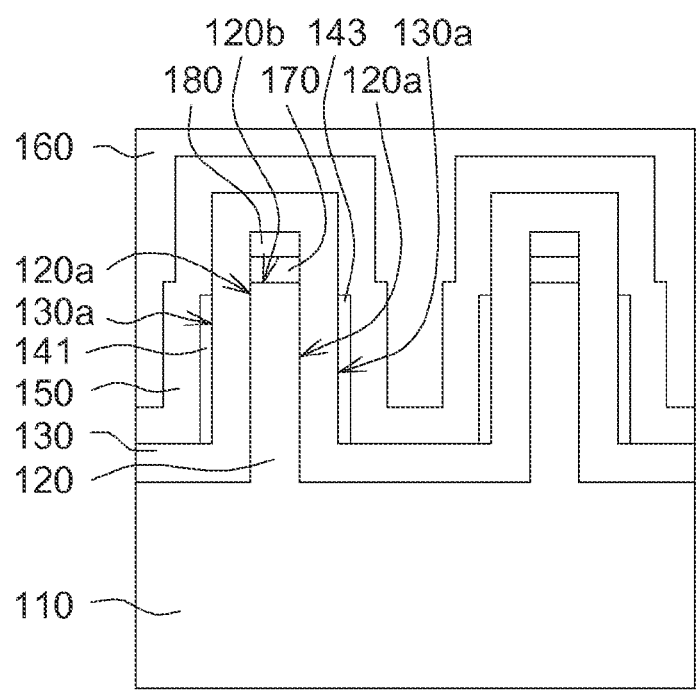
Figure 3A:
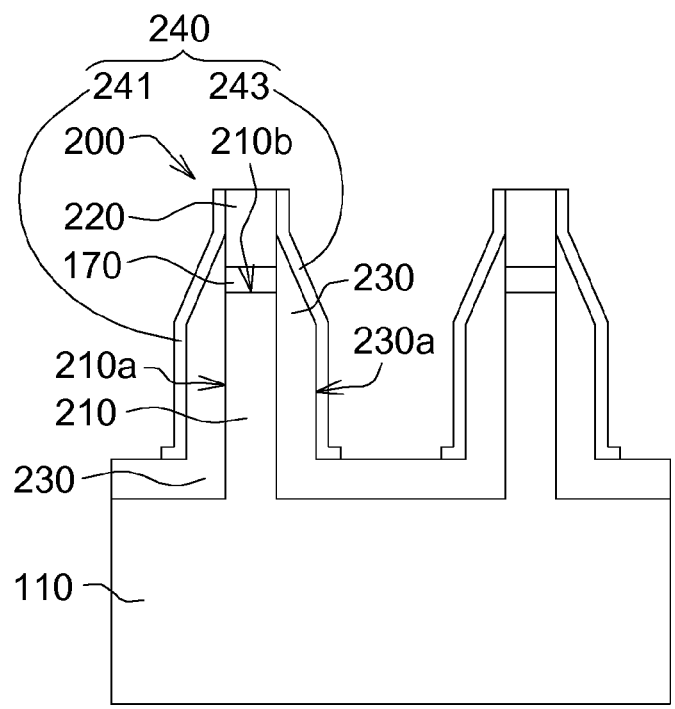
FIGS. 3A-3B show cross-sectional views along the section line 3-3' in FIG. 1.
Figure 3B:
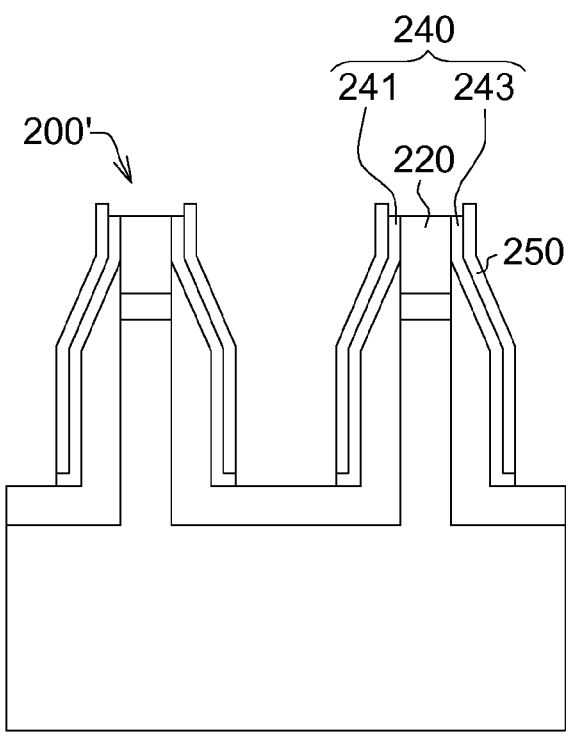

FIG. 1 shows a top view of a semiconductor structure according to an embodiment of the present disclosure. FIGS. 2A-2B show cross-sectional views along the section line 2-2' in FIG. 1. FIGS. 3A-3B show cross-sectional views along the section line 3-3' in FIG. 1. Also, it is important to point out that the drawings of elements in FIG. 1 are to be regard as an illustrative sense rather than a restrictive sense.

Please refer to FIG. 1 and FIG. 2A. Semiconductor structure 10 comprises a substrate 110, a main body structure 120, a first dielectric layer 130, a first conductive strip 141, a second conductive strip 143, a second dielectric layer 150, and a conductive structure 160. The main body structure 120 is formed on the substrate 110, and the first dielectric layer 130 is formed on the substrate 110 and surrounding two sidewalls 120a and a top portion 120b of the main body structure 120. The first conductive strip 141 and the second conductive strip 143 are formed on two sidewalls 130a of the first dielectric layer 130, respectively. The second dielectric layer 150 is formed on the first dielectric layer 130, the first conductive strip 141, and the second conductive strip 143. The conductive structure 160 is formed on the second dielectric layer 150. In the embodiment, the materials for the substrate 110, the main body structure 120, the first conductive strip 141, the second conductive strip 143, and the conductive structure 160 comprise silicon-containing materials, such as polysilicon. However, the material selections are depending on the conditions applied and are not limited to the materials aforementioned.

In one embodiment, take the semiconductor structure 10 as a memory device as an example, as shown in FIG. 2A, the main body structure 120, the first dielectric layer 130, the first conductive strip 141, the second conductive strip 143, the second dielectric layer 150, and the conductive structure 160 form a memory structure 100. For example, the first conductive strip 141 and the second conductive strip 143 can be channel elements, and the conductive structure 160 can be a word line structure.

The memory storage capacity of a memory device is determined by the number and the density of memory cells and the area of channel elements in memory cells. In the embodiment, the memory structure 100 can have a plurality of memory units C. For example, as shown in FIG. 2A, the memory structure 100 has two memory units C (the areas within the dotted-line squares). Each of the memory unit C has a channel element, which would be the first conductive strip 141 or the second conductive strip 143. In the embodiment, the first conductive strip 141 and the second conductive strip 143 have a height H and a width W, and the height H is larger than the width W. As such, a design of a vertical disposed channel element which is ultra thin horizontally (the term of "horizontally" here refers to a direction parallel to the surface 110a of the substrate 110) is provided. In one embodiment, the width W is equal to or smaller than 10 nm. In another embodiment, the width W is equal to or smaller than 6 nm. In one embodiment, the height H is between 15 and 60 nm.

With such design of the vertical disposed channel element which is ultra thin horizontally, the height H of the first conductive strip 141 and the second conductive strip 143 determines the volume for storing electrons. In other words, the height H determines the size of memory units C. The memory storage capacity is proportional to the volume for storing electrons. With the large height H of the first conductive strip 141 and the second conductive strip 143, an increased volume for storing electrons is obtained. The width W is relatively reduced, and hence, the memory storage capacity in a unit area in horizontal directions can be effectively increased. As such, the operation control and reliability of memory devices can be improved. Furthermore, the width W is a lot smaller than the height H, which makes the size of the memory units C along horizontal directions reduce significantly. As such, the size of memory devices can be reduced effectively while a sufficient memory storage capacity is maintained.

In addition, as shown in FIG. 2A, both sides of the main body structure 120 are disposed with the first conductive strips 141 or the second conductive strips 143. In such way, one memory structure 100 has two memory units C, which increases the number and the density of the memory units in the memory device, and hence, the memory storage capacity is increased.

In one embodiment, the substrate 110 is such as a polysilicon substrate or a SOI (silicon on insulator) substrate. The substrate 110 can have a high doping concentration to avoid an undesired capacitance effect. In one embodiment, the substrate 110 and the main body structure 120 are formed integrally, for example, the substrate 110 and the main body structure 120 are formed in one manufacturing process. In the embodiment, the substrate 110 and the main body structure 120 can be formed integrally from a SOI substrate, such that a bias voltage, such as grounding, can be easily applied on the main body structure 120 through the substrate 110.

In one embodiment, the main body structure 120 can comprise conductive materials, and the first conductive strip 141 and the second conductive strip 143 are spaced apart by the main body structure 120. As such, the electronic interference between the first conductive strip 141 and the second conductive strip 143 can be reduced.

In one embodiment, the first dielectric layer 130 is, for example, a dielectric material layer having low dielectric constant. In the embodiment, the second dielectric layer 150 may have a multi-layer structure, for example, which may be an ONO composite layers, an ONONO composite layers, or a BE-SONOS composite layers, or comprise, for example, an ONO structure formed by alternately stacking silicon oxide and silicon nitride. The second dielectric layer 150 may also be a single material layer, comprising silicon nitride, or silicon oxide such as silicon dioxide, silicon oxynitride, for trapping electrons.

In one embodiment, as shown in FIG. 2A, the conductive structure 160 can also be formed between the two adjacent memory structures 100 to separate apart the two second conductive strips 143 (or two first conductive strips 141) in the two adjacent memory structures 100. As such, the electronic interference between the two second conductive strips 143 (or two first conductive strips 141) in the two adjacent memory structures 100 can be reduced.

As shown in FIG. 2A, in one embodiment, the semiconductor structure can comprise an oxide layer 170. In the memory structure 100, the oxide layer 170 is formed on the top portion 120b of the main body structure 120.

As shown in FIG. 2B, in another embodiment, the semiconductor can comprise the oxide layer 170 and a conductive element layer 180. In the memory structure 100', the oxide layer 170 is formed on the top portion 120b of the main body structure 120, and the conductive element layer 180 is formed on the oxide layer 170.

As shown in FIG. 1, in one embodiment, the semiconductor structure 10 can comprise a first string selection line 191 and a second string selection line 193. The first string selection line 191 and the second string selection line 193 can be formed on the substrate 110. In the embodiment, the first string selection line 191 is electrically connected to the first conductive strip 141, and the second string selection line 193 is electrically connected to the second conductive strip 143.

As shown in FIG. 1, in one embodiment, the semiconductor structure 10 can comprise a source element 195. The source element 195 can be formed on the substrate 110. In the embodiment, the source element 195 is electrically connected to the first conductive strip 141 and the second conductive strip 143.

Please refer to FIG. 1 and FIG. 3A. In one embodiment, the semiconductor structure 10 can comprise a contact structure 200. The contact structure 200 can be formed on the substrate 110. The contact structure 200 is electrically connected to the first conductive strip 141 and the second conductive strip 143.

In the embodiment, as shown in FIG. 1 and FIG. 3A, the contact structure 200 comprises a contact main body structure 210, a conductive element 220, a dielectric layer 230, and a conductive layer 240. In the embodiment, the contact main body structure 210 is formed on the substrate 110, the conductive element 220 is formed on the contact main body structure 210, and the dielectric layer 230 is formed on two sidewalls 210a of the contact main body structure 210. The conductive layer 240 is formed on the dielectric layer 230. The conductive layer 240 is electrically connected to the conductive element 220, and the conductive layer 240 is electrically connected to the first conductive strip 141 and the second conductive strip 143.

In the embodiment, as shown in FIG. 3A, the conductive layer 240 comprises a first conductive layer 241 and a second conductive layer 243. The first conductive layer 241 and the second conductive layer 243 are formed on two sidewalls 230a of the dielectric layer 230, respectively.

In the embodiment, as shown in FIG. 1 and FIG. 3A, the first conductive layer 241 is electrically connected to the first conductive strip 141, and the second conductive layer 243 is electrically connected to the second conductive strip 143.

As shown in FIG. 3A, in one embodiment, the semiconductor structure 10 can comprise an oxide layer 170. In the contact structure 200, the oxide layer 170 is formed on the contact main body structure 210.

As shown in FIG. 3B, in another embodiment, the semiconductor structure 10 can comprise the oxide layer 170 and an insulating layer 250. In the contact structure 200', the oxide layer 170 is formed on the contact main body structure 210, and the insulating layer 250 is formed on the conductive layer 240.

In one embodiment, as shown in FIG. 1, the semiconductor structure 10 can comprise a plurality of contact structures 200, a plurality of first string selection lines 191, a plurality of second string selection lines 193, a plurality of source elements 195, and a plurality of memory structures 100. The contact structures 200, the source elements 195, and between which the memory structures 100 are electrically connected via the first conductive strips 141 and the second conductive strips 143. The memory structures 100 arranged parallel to the contact structures 200 are electrically connected via the conductive structure 160.

In one embodiment, take the semiconductor structure 10 as a memory device as an example, as shown in FIG. 1 and FIG. 3A, the conductive element 220 can be a bit line (BL) contact. The semiconductor structure 10 further comprises a plurality bit lines BL1-BL4, the first conductive strips 141 and second conductive strips 143 electrically connected to the memory structures 100 are regarded as local bit lines. The first conductive strip 141 and the second conductive strip 143 are electrically connected to a bit line via the conductive element 220.

The embodiments disclosed below are for elaborating a manufacturing method of the semiconductor structures of the disclosure. However, the descriptions disclosed in the embodiments of the disclosure such as detailed manufacturing procedures are for illustration only, not for limiting the scope of protection of the disclosure. Referring to FIGS. 4-14, FIGS. 4-14 illustrate a process for manufacturing a semiconductor structure according to one embodiment of the present disclosure.

Figure 4:
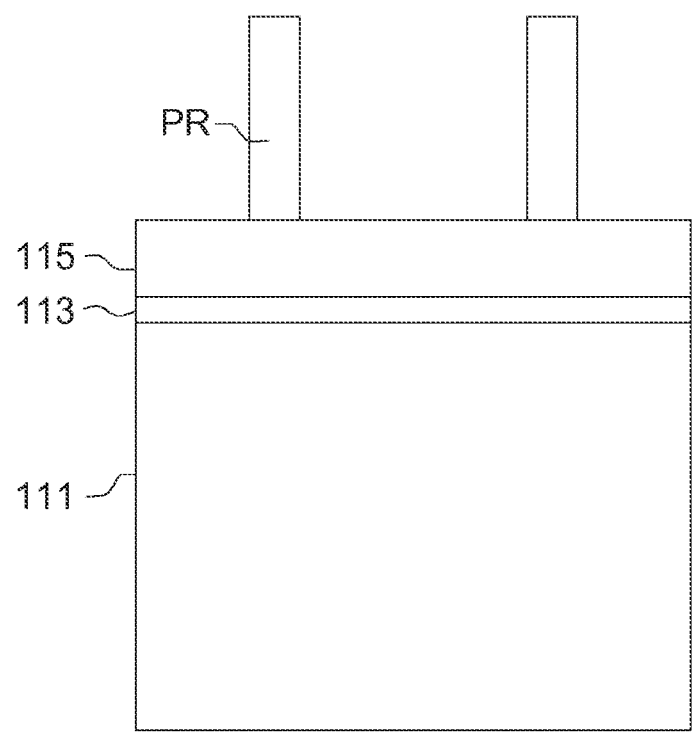
FIGS. 4-14 illustrate a process for manufacturing a semiconductor structure according to one embodiment of the present disclosure.
Figure 5:
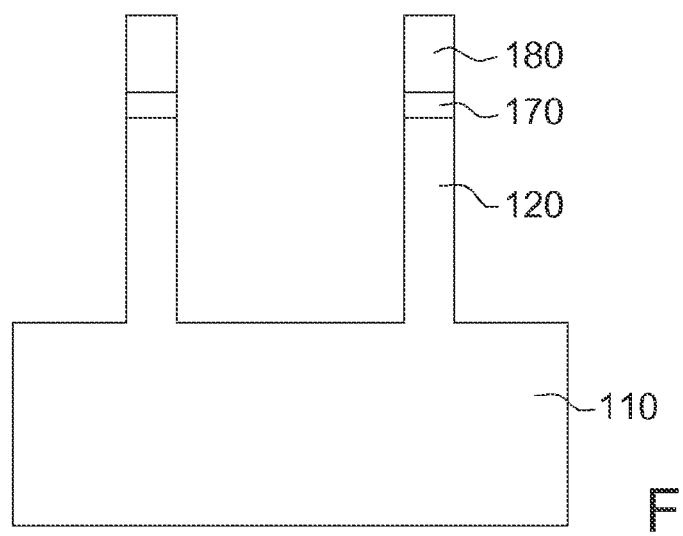

Referring to FIG. 4 to FIG. 5, a main body structure 120 is formed on the substrate 110. In the embodiment, the manufacturing method of forming the main body structure 120 on the substrate 110 comprises, for example: providing a base film 111 and etching the base film 111 to form the main body structure 120 and the substrate 110. The substrate 110 and the main body structure 120 are formed integrally.

In the embodiment, a contact main body structure 210 is also formed on the substrate 110. In one embodiment, the base film 111 is etched to form the contact main body structure 210. The step of forming the contact main body structure 210 on the substrate 110 and the step of forming the main body structure 120 on the substrate 110 are carried out at the same stage in the manufacturing procedure. The substrate 110, the contact main body structure 210, and the main body structure 120 are formed integrally.

In the embodiment, as shown in FIG. 4, the base film 111 is provided, an oxide material layer 113 is formed on the base film 111, a conductive element material layer 115 is formed on the oxide material layer 113, and then a photoresist layer PR is formed on the conductive element material layer 115.

Next, referring to FIG. 1 and FIG. 5, wherein FIG. 5 shows a cross-sectional view of the semiconductor structure on the memory structure 100 end in the following step. The base film 111, the oxide material layer 113, and the conductive element material layer 115 are etched according to a pattern of the photoresist PR to form the substrate 110, the main body structure 120, the oxide layer 170, and the conductive element layer 180 on the memory structure 100 end, and to form the substrate 110, the contact main body structure 210, the oxide layer 170, and the conductive element 220 on the contact structure 200 end (of which the structure is as shown in FIG. 3). The conductive element 220 is formed on a top portion 210b of the contact main body structure 210.

Next, the conductive element layer 180 (not shown) on the memory structure 100 end can be optionally removed.

Figure 6:
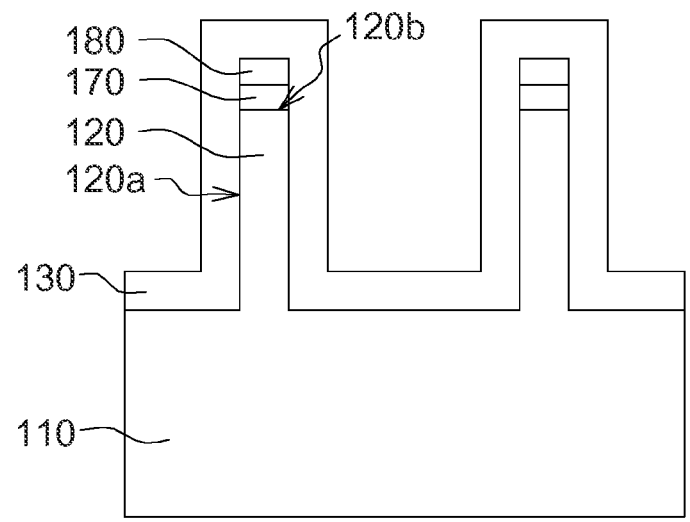

Referring to FIG. 6, wherein FIG. 6 shows a cross-sectional view of the semiconductor structure on the memory structure 100 end in the following step. A first dielectric layer 130 is formed on the substrate 110. The first dielectric layer 130 surrounds two sidewalls 120a and a top portion 120b of the main body structure 120.

In the embodiment, the first dielectric layer 130 is also formed on the conductive element 220, two sidewalls 210a of the contact main body structure 210, and the substrate 110 (not shown). In one embodiment, the step of forming the first dielectric layer 130 to surround the two sidewalls 120a and the top portion 120b of the main body structure 120 and the step of forming the first dielectric layer 130 on the conductive element 220, the two sidewalls 210a of the contact main body structure 210, and the substrate 110 are carried out at the same stage in the manufacturing procedure.

Figure 7A:
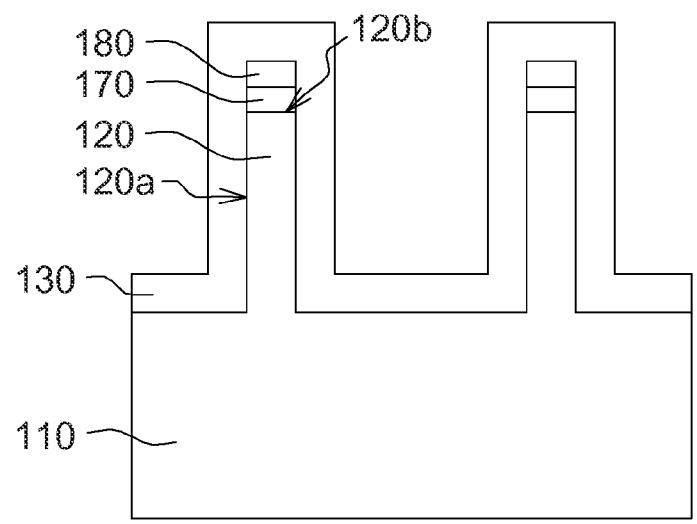
Figure 7B:
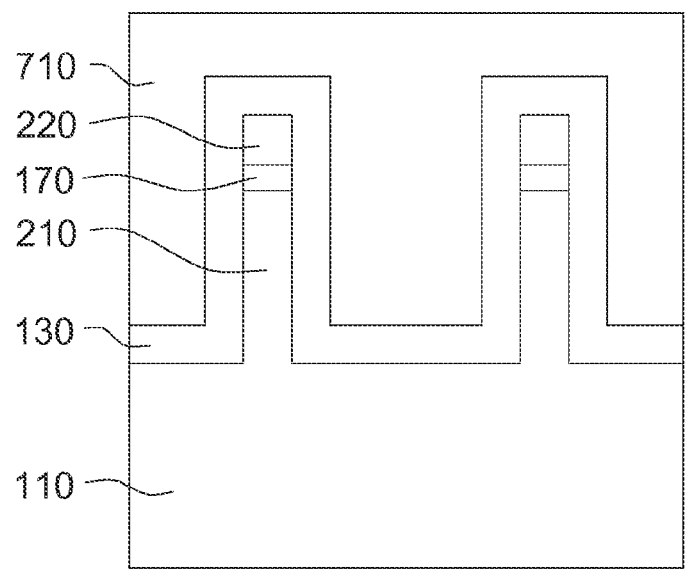
Figure 7C:
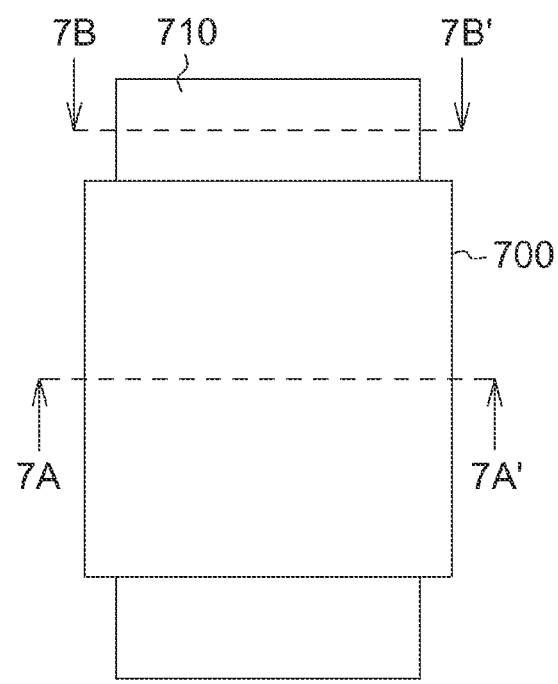
Figure 8A:
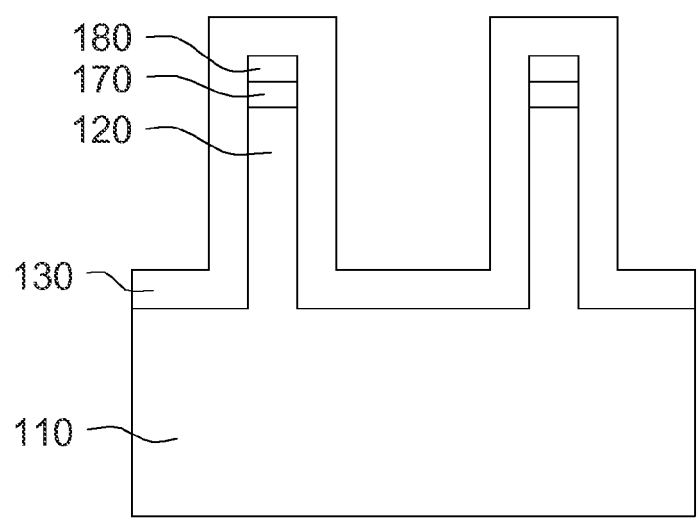
Figure 8B:
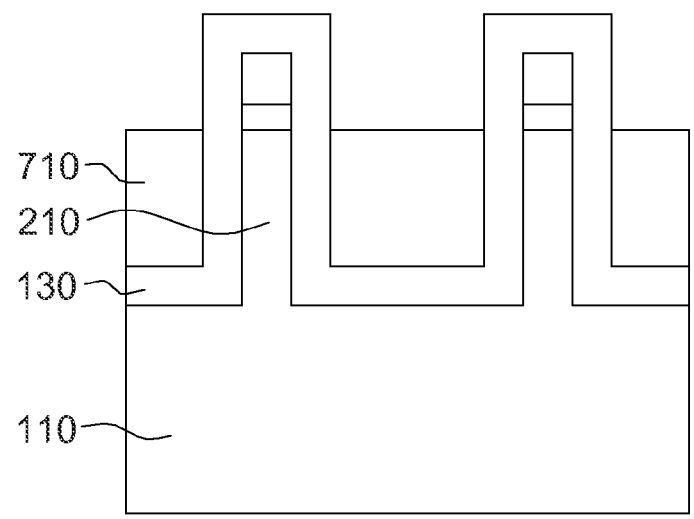
Figure 8C:
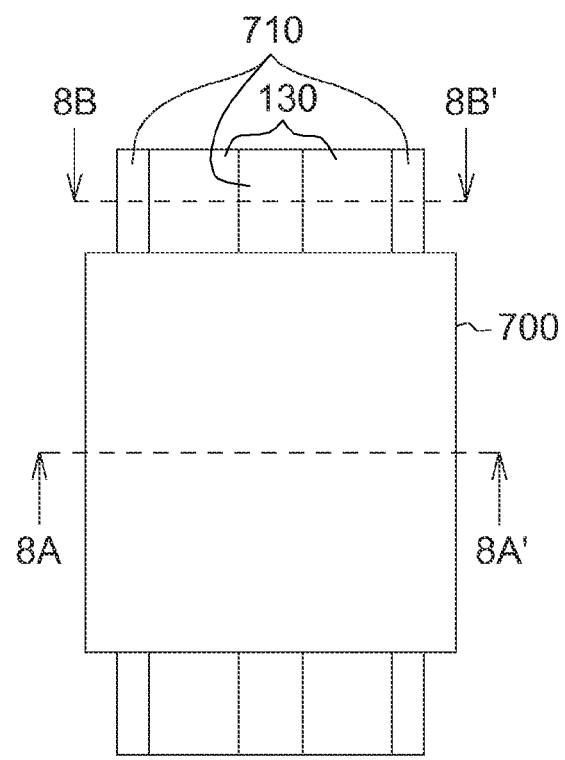
Figure 9A:
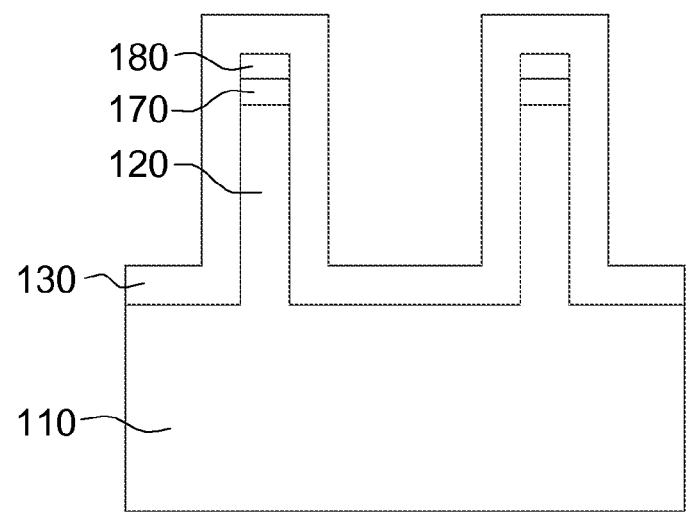
Figure 9B:
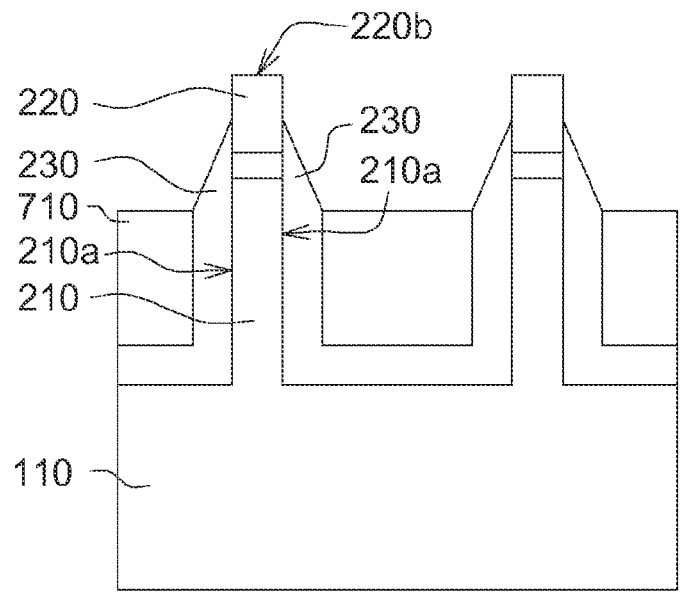
Figure 9C:
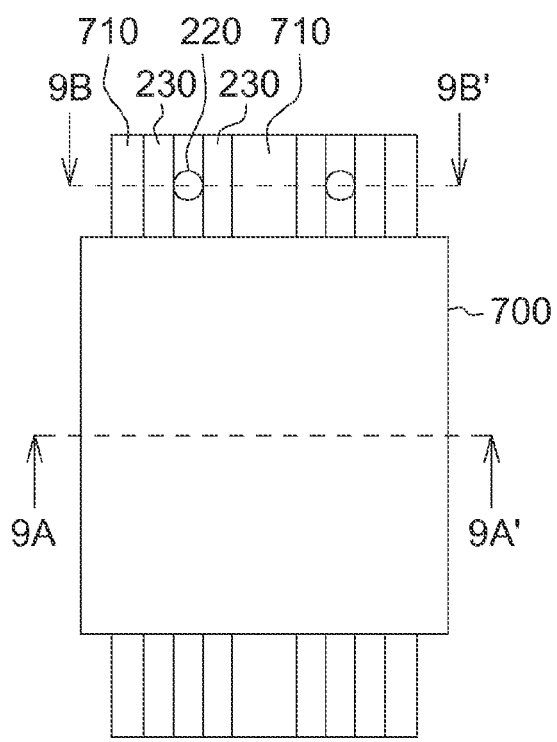

FIG. 7C, FIG. 8C, and FIG. 9C show top views of the semiconductor structure in the following steps, respectively. FIG. 7A, FIG. 8A, and FIG. 9A show cross-sectional views along the section lines 7A-7A', 8A-8A', and 9A-9A', respectively. FIG. 7B, FIG. 8B, and FIG. 9B show cross-sectional views along the section lines 7B-7B', 8B-8B', and 9B-9B', respectively. Also, it is important to point out that the drawings of elements in FIG. 7C, FIG. 8C, and FIG. 9C are to be regard as an illustrative sense rather than a restrictive sense. Referring to FIGS. 7A-7C, 8A-8C, and 9A-9C, a dielectric layer 230 is formed on two sidewalls 210a of the contact main body structure 210 and on the substrate 110.

In the embodiment, the manufacturing method of forming the dielectric layer 230 on the two sidewalls 210a of the contact main body structure 210 and on the substrate 110 comprises, for example: as shown in FIG. 7B and FIG. 7C, forming an organic dielectric layer (ODL) 710 on the first dielectric layer 130. In the embodiment, for example, a partial region of the whole structure can be covered by a covering layer 700 temporarily, such that the portion to form the contact structure in the following procedure is covered by the organic dielectric layer 710, and the portion to form the memory structure is not covered by the organic dielectric layer 710.

Next, as shown in FIG. 8B and FIG. 8C, the organic dielectric layer 710 is etched to expose part of the first dielectric layer 130. In the embodiment, a part of the dielectric layer 130 covering the contact main body structure 210 is exposed, and another part of the dielectric layer 130 covering the substrate 110 is not exposed.

Next, as shown in FIG. 9B and FIG. 9C, the first dielectric layer 130 is etched to form the dielectric layer 230 on the two sidewalls 210a of the contact main body structure 210 and the substrate 110 to expose the conductive element 220. In the embodiment, part of the first dielectric layer 130 on the contact main body structure 210 is etched from a side close to a top portion 220b of the conductive element 220. In the etching process, the portion covered by the organic dielectric layer 710 is not etched, and a portion of the dielectric layer 230 disposed on two sides of the contact main body structure 210 and extruded from the organic dielectric layer 710 forms a spacer structure. The height of the dielectric layer 230 decreases gradually from the part close to the two sidewalls 210a of the contact main body structure 210 to where away from the contact main body structure 210.

Figure 10A:
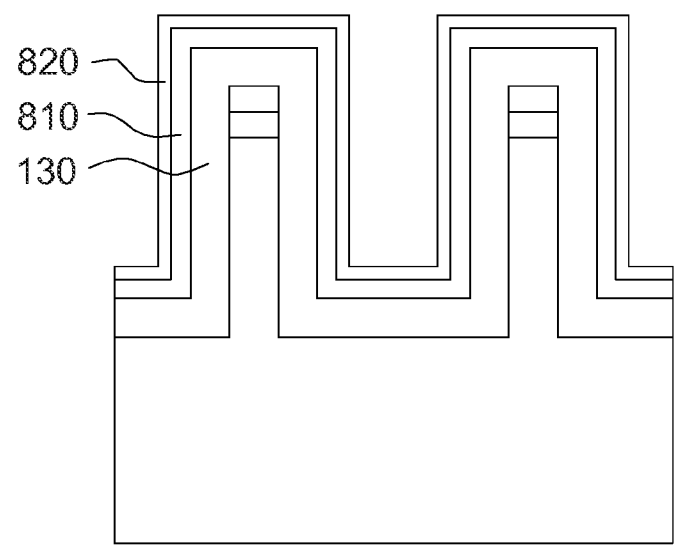
Figure 10B:
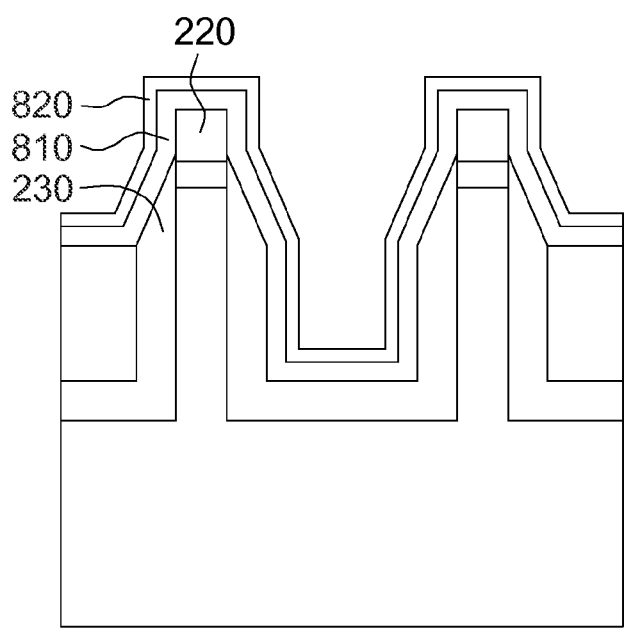
Figure 10C:
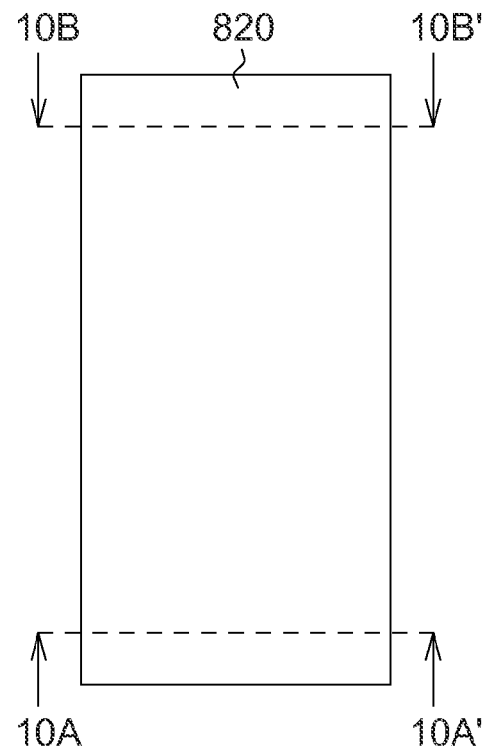
Figure 11A:
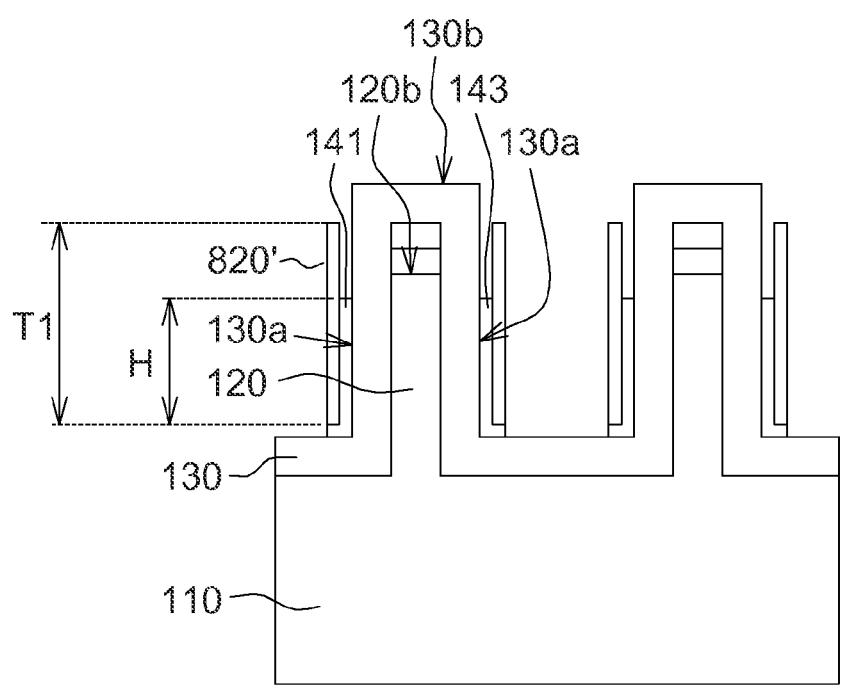
Figure 11B:
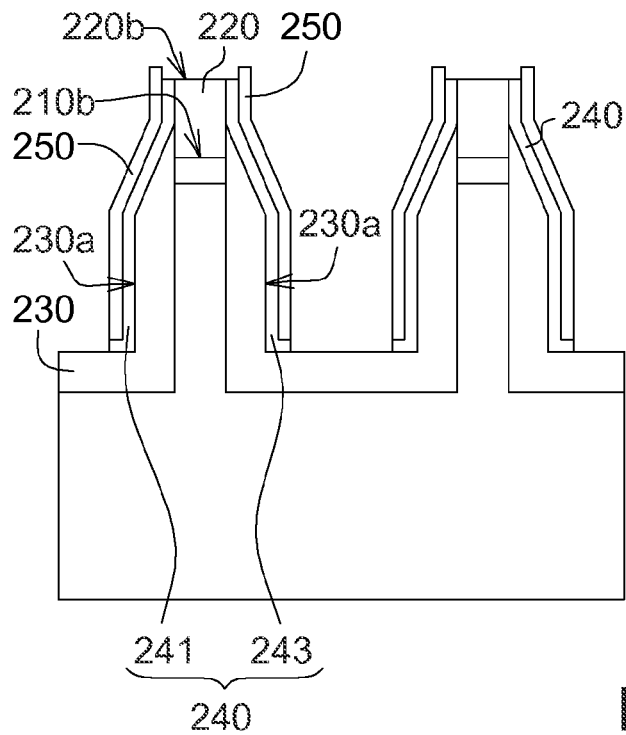
Figure 11C:
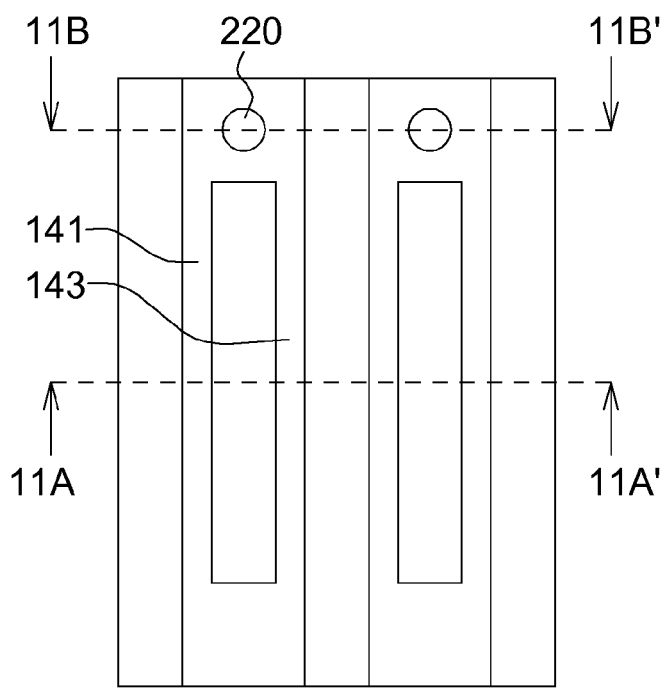

FIG. 10C and FIG. 11C show top views of the semiconductor structure in the following steps, respectively. FIG. 10A and FIG. 11A show cross-sectional views along the section lines 10A-10A' and 11A-11A', respectively. FIG. 10B and FIG. 11B show cross-sectional views along the section lines 10B-10B' and 11B-11B', respectively. Also, it is important to point out that the drawings of elements in FIG. 10C and FIG. 11C are to be regard as an illustrative sense rather than a restrictive sense. Referring to FIGS. 10A-10C and 11A-11C, a first conductive strip 141 and a second conductive strip 143 are formed on two sidewalls 130a of the first dielectric layer 130, respectively.

In the embodiment, the manufacturing method of forming the first conductive strip 141 and the second conductive strip 143 on the two sidewalls 130a of the first dielectric layer 130, respectively, comprises, for example: as shown in FIG. 10A and FIG. 10C, forming a conductive material layer 810 on the first dielectric layer 130 and forming an oxide material layer 820 on the conductive material layer 810. Next, as shown in FIG. 11A and FIG. 11C, the oxide material layer 820 and the conductive material layer 810 are etched to expose a top portion 130b of the first dielectric layer 130 and form the first conductive strip 141 and the second conductive strip 143 on the two sidewalls 130a of the first dielectric layer 130. In the embodiment, the oxide material layer 820 and the conductive material layer 810 are etched from a side close to the top portion 120b of the main body structure 120. Furthermore, the oxide material layer 820 and the conductive material layer 810 on the substrate 110 between the main body structures 120 are also etched to expose part of the first dielectric layer 130 between the main body structures 120.

In the embodiment, in the step of etching the oxide material layer 820 and the conductive material layer 810, an etching rate of the conductive material layer 810 is bigger than an etching rate of the oxide material layer 820. As such, a structure as shown in FIG. 11A is formed. The residual oxide material layer 820' has a height T1, which is bigger than the height H of the first conductive strip 141 and the second conductive strip 143.

Next, the residual oxide material layer 820' can be optionally removed (not shown).

In the embodiment, as shown in FIG. 11B, a conductive layer 240 is also formed on the dielectric layer 230. The conductive layer 240 is electrically connected to the conductive element 220. The manufacturing method of forming the conductive layer 240 on the dielectric layer 230 comprises, for example: as shown in FIG. 10B, forming the conductive material layer 810 on the dielectric layer 230 and the conductive element 220 and forming the oxide material layer 820 on the conductive material layer 810.

Next, the oxide material layer 820 and the conductive material layer 810 are etched to expose the top portion 220b of the conductive element 220. In the embodiment, the oxide material layer 820 and the conductive material layer 810 are etched from a side close to the top portion 210b of the contact main body structure 210. Furthermore, the oxide material layer 820 and the conductive material layer 810 on the substrate 110 between the contact main body structures 210 are also etched to expose part of the dielectric layer 230 between the contact main body structures 210. And hence, the conductive layer 240 is formed, and an insulating layer 250 is formed. The conductive layer 240 comprises a first conductive layer 241 and a second conductive layer 243 formed on two sidewalls 230a of the dielectric layer 230. The insulating layer 250 is formed on the conductive layer 240.

Figure 12A:
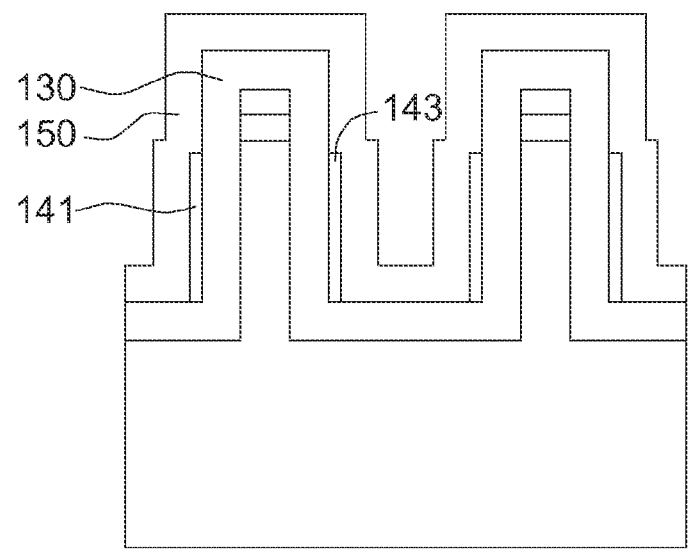
Figure 12B:
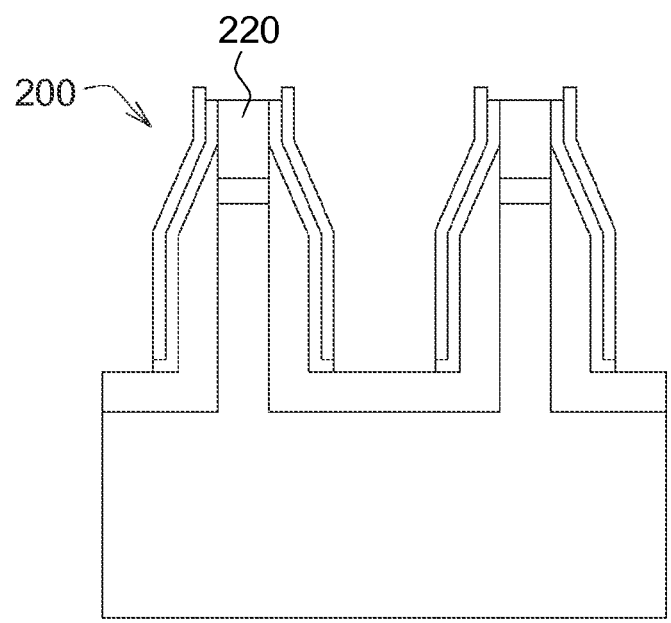
Figure 12C:
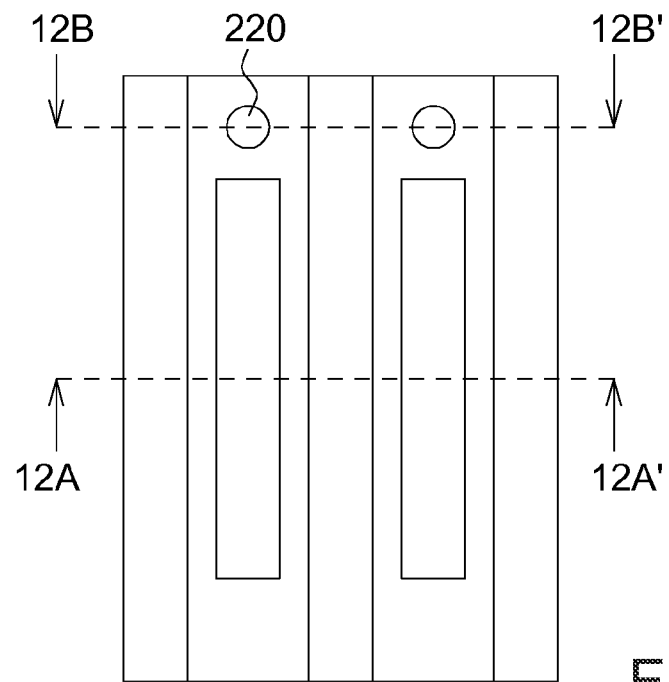
Figure 13A:
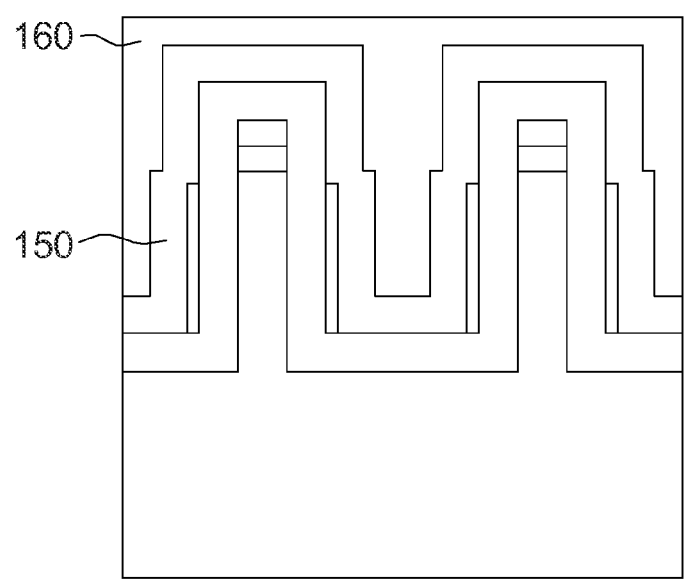
Figure 13B:
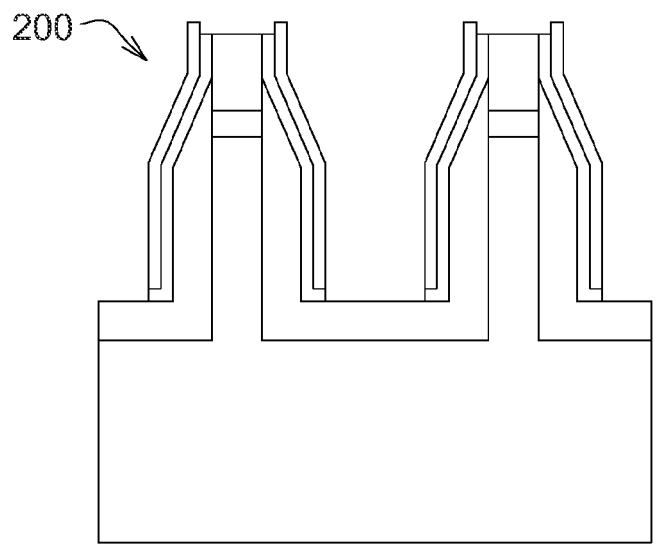
Figure 13C:
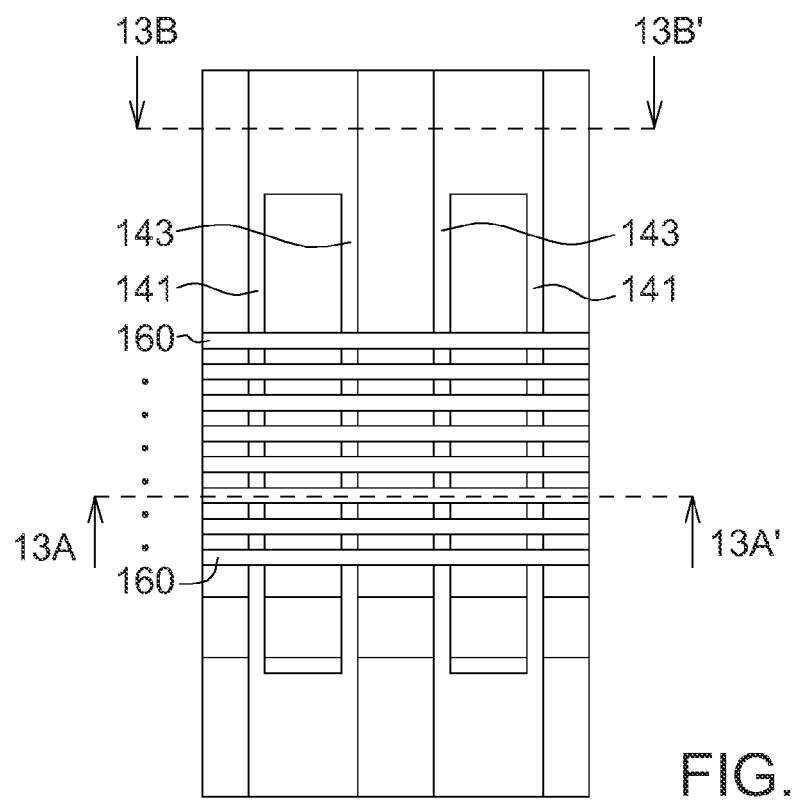

Please refer to FIGS. 12A-12C and 13A-13C. FIG. 12C and FIG. 13C show top views of the semiconductor structure in the following steps, respectively. FIG. 12A and FIG. 13A show cross-sectional views along the section lines 12A-12A' and 13A-13A', respectively. FIG. 12B and FIG. 13B show cross-sectional views along the section lines 12B-12B' and 11B-11B', respectively. Also, it is important to point out that the drawings of elements in FIG. 12C and FIG. 13C are to be regard as an illustrative sense rather than a restrictive sense.

As shown in FIG. 12A, a second dielectric layer 150 is formed on the first dielectric layer 130, the first conductive strip 141, and the second conductive strip 143. In the embodiment, as shown in FIG. 12B, the second dielectric layer 150 is not formed on the contact structure 200.

Next, as shown in FIG. 13A, a conductive structure 160 is formed on the second dielectric layer 150. In the embodiment, as shown in FIG. 13C, a plurality of strip-shaped conductive structures 160 is formed on the second dielectric layer 150. Each of the strip-shaped conductive structures 160 is electrically connected to a plurality of first conductive strips 141 and a plurality of second conductive strips 143. In the embodiment, a plurality strip-shaped insulating structures (not shown) can also be formed, and the strip-shaped conductive structures 160 are spaced apart by the strip-shaped insulating structures. In the embodiment, as shown in FIG. 13B, the conductive structure 160 is not formed on the contact structure 200.

Figure 14:
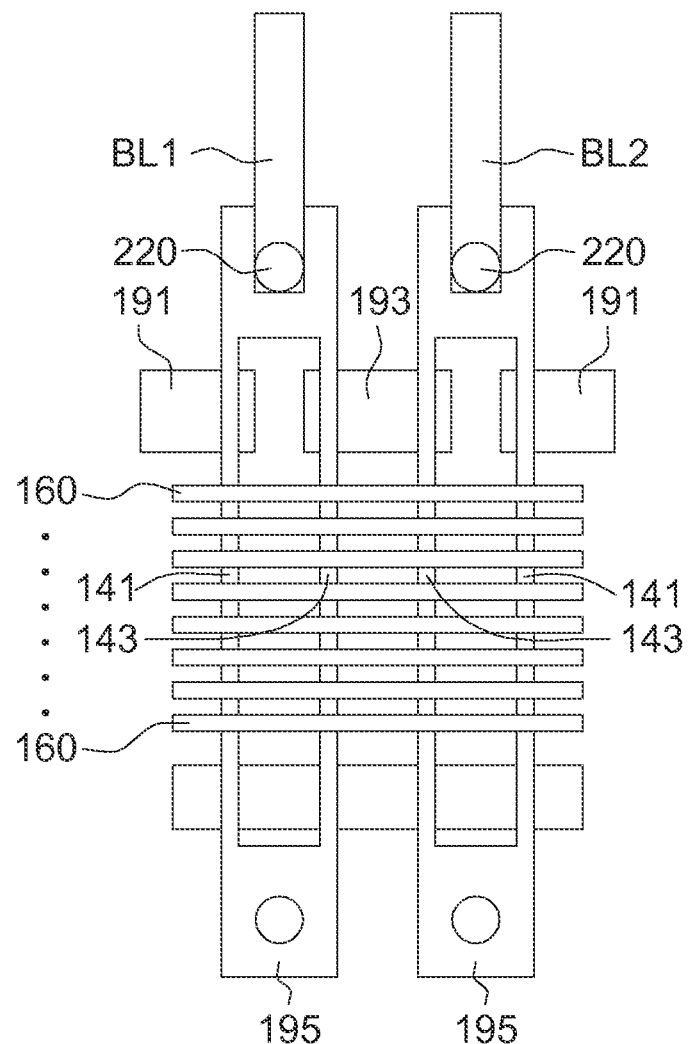

Referring to FIG. 14, FIG. 14 shows a top view of the semiconductor structure in the following step.

In the embodiment, a first string selection line 191 and a second string selection line 193 are also formed. In the embodiment, the first string selection line 191 and the second string selection line 193 can be formed on the substrate 110. As shown in FIG. 14, the first string selection line 191 is electrically connected to the first conductive strip 141, and the second string selection line 193 is electrically connected to the second conductive strip 143.

In the embodiment, a source element 195 can also be formed on the substrate 110. As shown in FIG. 14, the source element 195 is electrically connected to the first conductive strip 141 and the second conductive strip 143.

In the embodiment, a bit line BL1 is also formed on the conductive element 220. The bit line BL1 is electrically connected to the conductive element 220.

In the embodiment, a ground selection line 197 (GSL) is also formed. The ground selection line 197 is electrically connected to the first conductive strip 141 and the second conductive strip 143. In the embodiment, the plurality of conductive structures 160, the bit line BL1, and the ground selection line 197 can be spaced apart by a plurality of insulating structures.

The embodiments disclosed below are for elaborating the operating methods of the semiconductor structure of the disclosure. However, the descriptions disclosed in the embodiments of the disclosure are for illustration only, not for limiting the scope of protection of the disclosure.

Please refer to FIG. 1. In the embodiment, a plurality of first conductive strips 141 forms a group, a plurality of second conductive strips 141 forms another group, and the two groups are operated separately. Each of the first string selection lines 191 or the second string selection lines 193 controls two neighboring first conductive strips 141 or two neighboring second conductive strips 143. In one embodiment, in an operating process, first, at least one of the first conductive strips 141 and the second conductive strips 143 is selected to be turned on, and a zero voltage is applied on the selected conductive strip, or the selected conductive strip is grounded. Next, a bias voltage, such as a positive bias voltage (such as $+V_{cc}$), is applied to the other conductive strips that are not selected and to be turned off. In addition, a positive bias voltage (such as $+V_{cc}$) is applied to all of the conductive structures 160 (word line structures) and bit lines. In one embodiment, a voltage is applied to different string selection line groups stepwise. For example, the semiconductor structure 10 further comprises a first string selection line group and a second string selection line group, the first string selection line group comprises a plurality of first string selection lines 191 electrically connected to the first conductive strips 141, and the second string selection line group comprises a plurality of second string selection lines 193 electrically connected to the second conductive strips 143. In the embodiment, one of the first string selection line group and the second string selection line group is connected to the selected conductive strip to be turned on. In the two string selection line groups, first, a bias voltage is applied to the string selection lines of the string selection line group unconnected to the selected conductive strip, and bit line self-boosting is performed by a bias voltage $V_{cc}$ on the string selection lines and the unselected conductive strips. Next, a bias voltage $V_{cc}$ is applied to the string selection lines, which are unconnected to the selected conductive strip, of the another string selection line group, which is the group connected to the selected conductive strip among the first string selection line group and the second string selection line group. As such, all of the unselected bit lines are self-boosted, the unselected conductive structures 160 (word line structures) have a bias voltage $V_{pass}$ (such as 10 V), and the selected conductive structure 160 (word line structure) has a bias voltage (such as 20 V), which is higher than the bias voltage $V_{pass}$. The selected conductive strip to be turned on can be programmed.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure, comprising:
   a substrate;
   a main body structure formed on the substrate;
   a first dielectric layer formed on the substrate and surrounding two sidewalls and a top portion of the main body structure;
   a first conductive strip and a second conductive strip formed on two sidewalls of the first dielectric layer, respectively, wherein the first conductive strip is formed on one of the two sidewalls of the first dielectric layer, and the second conductive strip is formed on the other of the two sidewalls of the first dielectric layer;
   a second dielectric layer formed on the first dielectric layer, the first conductive strip, and the second conductive strip;
   an oxide layer formed between the second dielectric layer and the top portion of the main body structure, wherein a top surface of the first conductive strip and a top surface of the second conductive strip are below the oxide layer;
   a conductive structure formed on the second dielectric layer, and
   a conductive element layer formed between the oxide layer and the first dielectric layer, wherein the top surface of the first conductive strip and the top surface of the second conductive strip are below the conductive element layer.

2. The semiconductor structure according to claim 1, wherein the substrate and the main body structure are formed integrally.

3. The semiconductor structure according to claim 1, further comprising a first string selection line and a second string selection line, wherein the first string selection line is electrically connected to the first conductive strip, and the second string selection line is electrically connected to the second conductive strip.

4. The semiconductor structure according to claim 1, further comprising a source element formed on the substrate, wherein the source element is electrically connected to the first conductive strip and the second conductive strip.

5. The semiconductor structure according to claim 1, further comprising a contact structure formed on the substrate, wherein the contact structure is electrically connected to the first conductive strip and the second conductive strip.

6. The semiconductor structure according to claim 5, wherein the contact structure comprises:
   a contact main body structure formed on the substrate;
   a conductive element formed on the contact main body structure;
   a dielectric layer formed on two sidewalls of the contact main body structure; and
   a conductive layer formed on the dielectric layer, wherein the conductive layer is electrically connected to the conductive element, and the conductive layer is electrically connected to the first conductive strip and the second conductive strip.

7. The semiconductor structure according to claim 6, wherein the conductive layer comprises a first conductive layer and a second conductive layer, and the first conductive layer and the second conductive layer are formed on two sidewalls of the dielectric layer, respectively.

8. The semiconductor structure according to claim 7, wherein the first conductive layer is electrically connected to the first conductive strip, and the second conductive layer is electrically connected to the second conductive strip.

9. A manufacturing method of a semiconductor structure, comprising:
   forming a main body structure on a substrate;
   forming a first dielectric layer on the substrate, wherein the first dielectric layer surrounds two sidewalls and a top portion of the main body structure;

forming a first conductive strip and a second conductive strip on two sidewalls of the first dielectric layer, respectively;

forming a second dielectric layer on the first dielectric layer, the first conductive strip, and the second conductive strip;

forming an oxide layer between the second dielectric layer and the top portion of the main body structure, wherein a top surface of the first conductive strip and a top surface of the second conductive strip are below the oxide layer;

forming a conductive structure on the second dielectric layer, and a conductive element layer formed between the oxide layer and the first dielectric layer, wherein the top surface of the first conductive strip and the top surface of the second conductive strip are below the conductive element layer.

10. The method of manufacturing the semiconductor structure according to claim 9, wherein the step of forming the main body structure on the substrate comprises:
providing a base film; and
etching the base film to form the main body structure and the substrate, wherein the substrate and the main body structure are formed integrally.

11. The method of manufacturing the semiconductor structure according to claim 9, further comprising:
forming a first string selection line and a second string selection line, wherein the first string selection line is electrically connected to the first conductive strip, and the second string selection line is electrically connected to the second conductive strip.

12. The method of manufacturing the semiconductor structure according to claim 9, further comprising:
forming a source element on the substrate, wherein the source element is electrically connected to the first conductive strip and the second conductive strip.

13. The method of manufacturing the semiconductor structure according to claim 9, wherein the step of forming the first conductive strip and the second conductive strip comprises:
forming a conductive material layer on the first dielectric layer;
forming an oxide material layer on the conductive material layer;
etching the oxide material layer and the conductive material layer to expose a top portion of the first dielectric layer; and
removing the residual oxide material layer.

14. The method of manufacturing the semiconductor structure according to claim 13, wherein in the step of etching the oxide material layer and the conductive material layer, an etching rate of the conductive material layer is bigger than an etching rate of the oxide material layer.

15. The method of manufacturing the semiconductor structure according to claim 9, further comprising:
forming a contact structure on the substrate, wherein the contact structure is electrically connected to the first conductive strip and the second conductive strip.

16. The method of manufacturing the semiconductor structure according to claim 9, further comprising:
forming a contact structure on the substrate, comprising:
forming a contact main body structure on the substrate;
forming a conductive element on a top portion of the contact main body structure;
forming a dielectric layer on two sidewalls of the contact main body structure and on the substrate; and
forming a conductive layer on the dielectric layer, wherein the conductive layer is electrically connected to the conductive element.

17. The method of manufacturing the semiconductor structure according to claim 16, wherein the step of forming the conductive layer comprises:
forming a first conductive layer and a second conductive layer on two sidewalls of the dielectric layer.

18. An operating method of a semiconductor structure, comprising:
providing a semiconductor structure, comprising:
a substrate;
a plurality of main body structures formed on the substrate;
a plurality of first dielectric layers formed on the substrate and surrounding two sidewalls and a top portion of each of the main body structures;
a plurality of first conductive strips and a plurality of second conductive strips formed on two sidewalls of the first dielectric layers, respectively; and
a plurality of second dielectric layers formed on the first dielectric layer, the first conductive strips, and the second conductive strips;
a plurality of oxide layers formed between the second dielectric layers and the top portions of the main body structures, wherein a top surface of the first conductive strips and a top surface of the second conductive strips are below the oxide layers; and
a plurality of conductive structures formed on the second dielectric layers; and
a plurality of conductive element layers formed between the oxide layers and the first dielectric layers, wherein the top surface of the first conductive strip and the top surface of the second conductive strip are below the conductive element layers; and
selecting at least one of the first conductive strips and the second conductive strips to be turned on.

19. The operating method of the semiconductor structure according to claim 18, wherein the semiconductor structure further comprises a first string selection line group and a second string selection line group, the first string selection line group comprises a plurality of first string selection lines electrically connected to the first conductive strips, the second string selection line group comprises a plurality of second string selection lines electrically connected to the second conductive strips, one of the first string selection line group and the second string selection line group is connected to the selected conductive strip to be turned on, the operating method further comprises:
applying a zero voltage or grounding the selected conductive strip;
applying a first bias voltage to the conductive strips not selected and to be turned off;
applying a second bias voltage to the string selection lines of the group unconnected to the selected conductive strip among the first string selection line group and the second string selection line group; and
applying a third bias voltage to the string selection lines, which are unconnected to the selected conductive strip, of the group connected to the selected conductive strip among the first string selection line group and the second string selection line group.

* * * * *